United States Patent
Kawabata

(10) Patent No.: US 10,672,687 B2
(45) Date of Patent: Jun. 2, 2020

(54) SEMICONDUCTOR DEVICE

(71) Applicant: SUMITOMO ELECTRIC INDUSTRIES, LTD., Osaka (JP)

(72) Inventor: Yoshisumi Kawabata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/316,697

(22) PCT Filed: Jun. 27, 2017

(86) PCT No.: PCT/JP2017/023636
§ 371 (c)(1),
(2) Date: Jan. 10, 2019

(87) PCT Pub. No.: WO2018/012281
PCT Pub. Date: Jan. 18, 2018

(65) Prior Publication Data
US 2019/0295931 A1    Sep. 26, 2019

(30) Foreign Application Priority Data

Jul. 14, 2016   (JP) ................. 2016-139448

(51) Int. Cl.
*H01L 23/495*   (2006.01)
*H01L 23/00*    (2006.01)
*H01L 23/48*    (2006.01)
*H01L 25/18*    (2006.01)
*H01L 25/07*    (2006.01)

(52) U.S. Cl.
CPC ........ *H01L 23/49503* (2013.01); *H01L 23/48* (2013.01); *H01L 23/49562* (2013.01); *H01L 24/09* (2013.01); *H01L 24/49* (2013.01); *H01L 25/07* (2013.01); *H01L 25/18* (2013.01)

(58) Field of Classification Search
CPC ........ H01L 23/49503; H01L 23/49562; H01L 24/48; H01L 23/48; H01L 24/09; H01L 24/49; H01L 25/07; H01L 25/18
See application file for complete search history.

(56) References Cited

U.S. PATENT DOCUMENTS 7,791,182 B2    9/2010  Yong et al.
2014/0225661 A1*  8/2014  Otremba ................. G05F 3/02
                                            327/530
2018/0096961 A1*  4/2018  Hashizume ......... H01L 23/3114

FOREIGN PATENT DOCUMENTS

JP   S56-021450 U   2/1981
JP   H06-037221     2/1994
JP   2005-026294    1/2005

* cited by examiner

Primary Examiner — Jasmine J Clark
(74) Attorney, Agent, or Firm — IPUSA, PLLC

(57) ABSTRACT

A semiconductor device includes a die pad, and a first lead integrally connected to the die pad. A second lead and a third lead are arranged laterally away from the first lead. A semiconductor element including a first lateral surface and a second lateral surface adjacent to each other and a third lateral surface located opposite to the first lateral surface and adjacent to the second lateral surface, is mounted on the die pad. A plurality of first conductive members electrically connects the at least part of a main electrode pad to the end on the die pad side of the second lead. A second conductive member connects a control electrode pad to the end on the die pad side of the third lead.

7 Claims, 2 Drawing Sheets

SEMICONDUCTOR DEVICE

TECHNICAL FIELD

The present disclosure relates to a semiconductor device.

The present application is based on and claims priority to Japanese Patent Application No. 2016-139448 filed on Jul. 14, 2016, the entire contents of which are herein incorporated by reference.

BACKGROUND ART

A device including a die pad as a support substrate, a semiconductor element, a first lead, a second lead, and a third lead is known as a semiconductor device. In such a semiconductor device, the first lead is integrally connected to the die pad, and the second lead and the third lead are arranged laterally away from the first lead so that the first lead is interposed between the second lead and the third lead. The semiconductor element is mounted on the die pad so as to be electrically connected to the die pad. A main electrode pad of the semiconductor element (for example, a source electrode pad or an emitter electrode pad) is connected to the second lead by way of a plurality of first conductive members (for example, wires), and a control pad of the semiconductor element (a gate electrode pad) is connected to the third lead by way of a second conductive member (for example, a wire).

Patent Document 1: Japanese Laid-Open Patent Application Publication No. 2005-26294
Patent Document 2: U.S. Pat. No. 7,791,182 specification

SUMMARY OF THE INVENTION

A semiconductor substrate according to an embodiment of the present disclosure includes a die pad, and a first lead integrally connected to the die pad. A second lead is arranged laterally away from the first lead and provided apart from the die pad and the first lead. A third lead is arranged laterally away from the first lead and provided apart from the die pad, the first lead and the second lead. A semiconductor element including a first lateral surface and a second lateral surface adjacent to each other, and a third lateral surface located opposite to the first lateral surface and adjacent to the second lateral surface is mounted on the die pad such that the first lateral surface faces an end on the die pad side of the second lead and such that the second lateral surface faces an end on the die pad side of the third lead in a planar view. A main electrode pad is provided on a surface opposite to the die pad of the semiconductor element such that at least part of the main electrode pad is located on the first lateral surface side. A control electrode pad is provided on the surface opposite to the die pad of the semiconductor element such that at least part of the control electrode pad is located on the third lateral surface side. A plurality of first conductive members electrically connects the at least part of the main electrode pad to the end on the die pad side of the second lead. A second conductive member connects the control electrode pad to the end on the die pad side of the third lead.

MODE OF CARRYING OUT THE INVENTION

Figure 1:
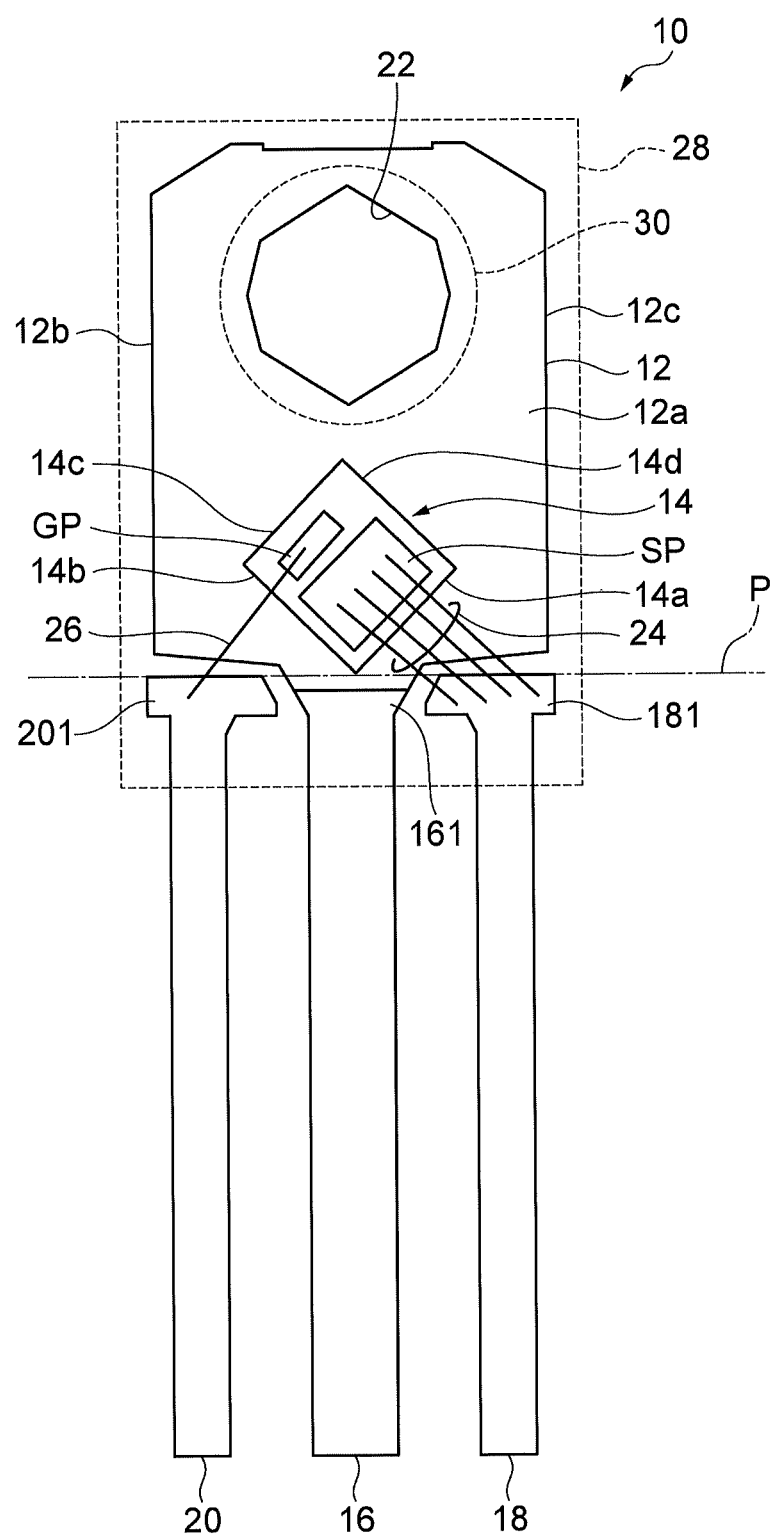
FIG. 1 is a plan view schematically illustrating a semiconductor device according to a first embodiment.

Description of Embodiments of the Present Disclosure

Like semiconductor devices described in Patent Documents 1 and 2, in a form of connecting a main pad of a semiconductor element (for example, a source electrode pad or an emitter electrode pad) to leads provided in a semiconductor device with a plurality of first conductive members, current density in the semiconductor element sometimes becomes uneven.

Therefore, the present disclosure aims at providing a semiconductor device that can make current density in a semiconductor element uniform.

Embodiments of the present disclosure are described below with reference to the drawings. In the description of the drawings, same numerals are attached to the same components, and an overlapping description is omitted.

Description of Embodiments of the Present Disclosure

To begin with, embodiments of the present disclosure are listed and described below.

A semiconductor device according to one embodiment includes a die pad, a first lead integrally connected to the die pad, a second lead arranged laterally away from the first lead and provided apart from the die pad and the first lead, a third lead arranged laterally away from the first lead and provided apart from the die pad, the first lead and the second lead, a semiconductor element including a first lateral surface and a second lateral surface adjacent to each other and a third lateral surface located opposite to the first lateral surface and adjacent to the second lateral surface, and mounted on the die pad such that the first lateral surface faces an end on the die pad side of the second lead and that the second lateral surface faces an end on the die pad side of the third lead in a planar view, a main electrode pad provided on a surface opposite to the die pad of the semiconductor element such that at least part of the main electrode pad is located on the first lateral surface side, a control electrode pad provided on the surface opposite to the die pad of the semiconductor element such that at least part of the control electrode pad is located on the third lateral surface side, a plurality of first conductive members electrically connecting the at least part of the main electrode pad to the end on the die pad side of the second lead, and a second conductive member connecting the control electrode pad to the end on the die pad side of the third lead.

In the above configuration, the semiconductor element is arranged on the die pad side so that a first lateral surface of the semiconductor element faces an end part on the die pad side of the second lead, and at least one part of the main electrode pad is located on the first lateral surface side. Hence, because at least one part of the main electrode pad can be linearly connected to the end part on the die pad of the second lead with the plurality of first conductive members, and because the plurality of first conductive members can be arranged parallel to each other when seen from above or below in a thickness direction of the die pad, the plurality of first conductive members can be arranged evenly. In this case, a current is likely to be uniformly supplied to the main current pad, and uniform current density is achieved in the semiconductor element.

In one embodiment, the end part on the die pad side of the second lead may be linearly connected to the main electrode pad with the plurality of first conductive members in a planar view, and the plurality of first conductive members may be arranged parallel to each other.

In one embodiment, an extending direction of each of the plurality of first conductive members may cross an extending direction of the second conductive member at right angles.

In one embodiment, the third lead may be arranged opposite to the second lead with respect to the first lead, and facing surfaces that a first facing part facing the end on the die pad side of the second lead in the die pad includes and that the end on the die pad side of the second lead includes may be parallel to each other. Hence, the current density in the semiconductor element can be made more uniform.

In one embodiment, facing surfaces that a second facing part facing the end on the die pad side of the third lead in the die pad includes and that the end on the die pad side of the third lead includes are parallel to each other. In this case, inductance can be decreased because the end part on the die pad side of the third lead can be connected to the control electrode pad with a shorter second conductive member.

In one embodiment, the first lateral surface is parallel to the facing surface included in the first facing part. In this case, the plurality of first conductive members is readily arranged evenly.

In one embodiment, at least part of the main electrode pad is formed into a rectangular shape extending from the third lateral surface to the fourth lateral surface.

Details of Embodiments of the Present Invention

Specific examples of embodiments of the present disclosure are described below with reference to the drawings. The present disclosure is not limited to these illustrations, but is indicated by a scope of claims, and is intended to contain the scope of claims and its equivalents, and the all changes in the scope. The same numerals are attached to the same components in a description of the drawings and an overlapping description is omitted. A proportion of size in the drawings does not necessarily coincide with that of the description.

First Embodiment

FIG. 1 is a plan view schematically illustrating a semiconductor device according to a first embodiment. The semiconductor device 10 illustrated in FIG. 1 is a resin-sealing type semiconductor device. The semiconductor device 10 includes a die pad 12, a semiconductor chip (semiconductor element) 14, a first lead 16, a second lead 18 and a third lead 20. The die pad 12, the first lead 16, the second lead 18 and the third lead 20 can form a lead frame.

The semiconductor device 10 is, for example, a power semiconductor device used in a power source and the like. An example of a packaging form of the semiconductor device 10 may be a commonly used TO (Transistor Outline) series. Examples of the TO series include TO-247, TO-220, TO-263 (D2-PAK), TO-252 (D-PAK).

The die pad 12 is a mounting substrate including a chip mounting surface 12a on which the semiconductor chip 14 is mounted. The die pad 12 can be electrically connected to the semiconductor chip 14. The die pad 12 forms, for example, a plate shape. An example of a shape of the chip mounting surface 12a is approximately rectangular. Examples of a material of the die pad 12 include a copper (Cu) and a metal such as a copper alloy. A through hole 22 that penetrates though the die pad 12 in a thickness direction can be formed in the die pad 12. The though hole 22 is a hole to let the screw through when the semiconductor device 10 is fixed to another member, for example, by the screw.

The semiconductor chip 14 is mounted on a predetermined position of the chip mounting surface 12a. The semiconductor chip 14 is a transistor. Examples of the transistor include a bipolar transistor, a MOSFET (Metal-Oxide-Semiconductor Field-Effect Transistor), an insulating gate bipolar transistor (IGBT: Insulated Gate Bipolar Transistor) and the like. The semiconductor chip 14 can be mounted on the chip mounting surface 12a via an adhesive layer that is composed of a material containing a lead-containing metal solder, lead-free metal solder, a material-containing conductive resin or the like.

Examples of the semiconductor chip 14 include a wide bandgap semiconductor, silicon and the like. The wide bandgap semiconductor has a bandgap that is greater than a bandgap of silicon. Examples of the wide bandgap semiconductor include silicon carbide (SiC), gallium nitride (GaN), diamond and the like.

The semiconductor chip 14 includes a first lateral surface 14a, a second lateral surface 14b, a third lateral surface 14c, and a fourth lateral surface 14d. The second lateral surface 14b intersects with the first lateral surface 14a. In other words, the first lateral surface 14a and the second lateral surface 14b are adjacent to each other, and arranged closely. The third lateral surface 14c is located opposite to the first lateral surface 14a, and intersects with the second lateral surface 14b. In other words, the second lateral surface 14b and the third lateral surface 14c are adjacent to each other, and arranged closely. The fourth lateral surface 14d is located opposite to the second lateral surface 14b, and intersects with the first lateral surface 14a and the third lateral surface 14c. In other words, the fourth lateral surface 14d and the first lateral surface 14a are adjacent to each other, and are arranged closely. When seen from the thickness direction of the semiconductor chip 14, which means in a planar view, the shape of the semiconductor chip 14 is, for example, a rectangle or a square shape.

The semiconductor chip 14 includes a gate electrode pad (control electrode pad) GP and an electrode pad (main electrode pad) SP. When the semiconductor chip 14 is a MOSFET, the electrode pad SP corresponds to a source electrode pad. When the semiconductor chip 14 is an IGBT, the electrode pad SP corresponds to an emitter electrode pad. An additional electrode pad such as a drain electrode pad and a collector electrode pad can be formed on the entire back surface of the semiconductor chip 14. When the electrode pad SP is referred to as a first main electrode pad, the electrode pad formed on the entire back surface of the semiconductor chip 14 is a second main electrode pad. A conductive state between the first main electrode pad and the second main electrode pad in the semiconductor chip 14 can be controlled.

The gate electrode pad GP and the electrode pad SP are provided on an upper part (opposite side of the die pad 12) of the semiconductor chip 14. The electrode pad SP and the gate electrode pad GP are regions to which respective ends of the plurality of first conductive members 24 and second conductive members 26 described later are connected.

Shapes of the electrode pad SP and the gate electrode pad GP can be formed into a rectangular shape as illustrated in FIG. 1. When the shape of the electrode pad SP is rectangular, the electrode pad SP can be arranged so that a lengthwise direction of the electrode pad SP is orthogonal to a normal direction of the first lateral surface 14a. The gate electrode pad GP is arranged similarly. Hereinafter, without specific remarks, the shapes of the electrode pad SP and the gate electrode pad GP are rectangular. Normally, an area of the electrode pad SP is larger than an area of the gate electrode pad GP.

On the upper part of the semiconductor chip 14, the electrode pad SP is located close to the first lateral surface 14a, and the gate electrode pad GP is located close to the third lateral surface 14c. Hence, the electrode pad SP is located on the first lateral surface side 14a with respect to the gate electrode pad GP. Moreover, the gate electrode pad GP is located on the third lateral surface side 14c with respect to the electrode pad SP. Hence, naturally, the electrode pad SP is located closer to the first lateral surface 14a than the third lateral surface 14c, and the gate electrode pad GP is arranged closer to the third lateral surface 14c than the first lateral surface 14a.

The first lead 16 extends in a single direction, and is arranged between the second lead 18 and the third lead 20. When a shape of the die pad 12 is rectangular, an extending direction of the first lead 16 can be a lengthwise direction of the die pad 12. Examples of materials of the first lead 16 include a same material as a material of the die pad 12. An inner end part 161 of the first lead 16 is connected to the die pad 12 in a physically integrated manner. The "connected" means that the die pad 12 and the first lead 16 are physically integrated together, and the die pad 12 and the first lead 16 may be integrally formed from the beginning, or the first lead 16 may be bonded with the inner end part 161 of the first lead. In other words, the first lead 16 and the die pad 12 just have to be formed integrally, and the first lead 16 just has to have a shape of extending from a predetermined position of the die pad 12 in a planar view. FIG. 1 illustrates a shape of the first lead 16 extending from a position between the second lead 18 and the third lead 20 of the die pad 12. Because the die pad 12 has conductivity, the first lead 16 and the die pad 12 are electrically connected.

The second lead 18 extends in the same direction as the extending direction of the first lead 16. The inner end part (the end on the die pad side) 181 of the second lead 18 is apart from the die pad 12. That is, the second lead 18 is provided apart from the die pad 12, the first lead 16 and the third lead 20. The second lead 18 is connected to the semiconductor chip 14 by way of the plurality of first conductive members 24. One end of each of the first conductive members 24 is connected to the electrode pad SP of the semiconductor chip 24, and the other end of each of the first conductive members 24 is connected to the inner end part 181 of the second lead 18. The shape of the inner end part 181 may be a shape capable of securing a region to which the plurality of first conductive members 24 is connectable.

The third lead 20 extends in the same direction as the extending direction of the first lead 16, and is arranged laterally away from the first lead 16. The third lead 20 is arranged on the opposite side of the second lead 18 with respect to the first lead 16. An inner end part (an end on the die pad) 201 of the third lead 20 is apart from the die pad 201. That is, the second lead 18 is provided apart from the die pad 12, the first lead 16 and the third lead 20. The third lead 20 is connected to the semiconductor chip 14 via the second conductive member 26. One end of the second conductive member 26 is connected to the gate electrode pad GP of the semiconductor chip 14, and the other end of the second conductive member 26 is connected to the inner end part 201 of the third lead 20. The shape of the inner end part 201 may ensure a region to which the second conductive member 26 is connectable.

When the semiconductor chip 14 is a MOSFET, the first lead 16 corresponds to a drain electrode terminal; the second lead 18 corresponds to a source electrode terminal, and the third lead 20 corresponds to a gate electrode terminal. When the semiconductor chip 14 contains an IGBT, the first lead 16 corresponds to a collector electrode terminal; the second lead 18 corresponds to an emitter electrode terminal; and the third lead 20 corresponds to a gate electrode terminal.

Examples of materials of the second lead 18 and the third lead 20 include copper and a metal such as a copper alloy. A wire, a binding ribbon and the like are cited as examples of the first conductive member 24 and the second conductive member 26. When the first conductive member 24 is a wire, the diameter thereof is, for example, from 300 μm to 500 μm. When the second conductive member 26 is a wire, the diameter thereof is, for example, 125 μm. Examples of materials of the first conductive member 24 and the second conductive member 26 include metal such as aluminum, gold, and copper. The first conductive member 24 is electrically connected to the second lead 18 and the semiconductor chip 14, for example, by wire bonding using ultrasound or pressurization. Similarly, the second conductive member 26 is electrically connected to the third lead 20 and the semiconductor chip 14 for example, by wire bonding using ultrasound or pressurization.

The die pad 12 and the semiconductor chip 14 can be sealed by a resin part 28. FIG. 1 schematically illustrates the resin part 28 by a broken line. The inner end parts 181, 201 of the second lead 18 and the third lead 20 are held by the resin part 28. Inner parts of the resin part 28 of the first lead 16, the second lead 18 and the third lead 20 are generally known as inner lead parts and are referred to as such. Outer parts of the resin parts 28 of the first lead 16, the second lead 18 and the third lead 20 are generally known as outer lead parts and are referred to as such.

An approximate cuboid is cited as an example of the outer shape of the resin part 28. Examples of the material of the resin part 28 include thermoplastic resin such as polyphenylene sulfide resin (PPS resin) and liquid crystalline polymer. The resin part 28 can be formed by molding the die pad 12 and the semiconductor chip 14. A through hole 30 concentric to the through hole 22 of the die pad 12 is formed in the resin part 28. The through hole 30 is a hole to allow a screw to penetrate therethrough when performing screw fixing similarly to the through hole 22.

In one embodiment, the bottom surface that is a surface opposite to the chip mounting surface 12a of the die pad 12 can be opened. In other words, the bottom surface can be a surface uncovered with the resin part 28. In this case, the bottom surface serves as a heat release surface.

An arrangement state of the semiconductor chip 14 relative to the die pad 12 and an interconnection state by the plurality of first conductive members 24 and the second conductive member 26 are described below.

The semiconductor chip 14 is arranged so that the first lateral surface 14a faces the inner end part 181 of the second lead 18 and that the second lateral surface 14b faces the inner end part 201 of the third lead 20. That is, the semiconductor chip 14 is arranged on the die pad 12 so that the first lateral surface 14a faces the inner end part 181 of the second lead 18 and that the second lateral surface 14b faces the inner end part 201 of the third lead 20. In other words, the semiconductor chip 14 is arranged on the die pad 12 in a state of being inclined with respect to a virtual reference plane P (surface indicated by a dashed-dotted line) that is orthogonal to the extending direction of the first lead 16, more exactly, in a state of the first lateral surface 14a inclined with respect to to virtual reference plane P. An angle of the first lateral surface 14a relative to the virtual reference plane P can be set while considering easiness of an interconnection by the first conductive materials 24 and the second conductive material 26, for example, and is set at 45 degrees, for example. The virtual reference plane P can be a surface that is orthogonal to the pair of lateral surfaces 12b and 12c of the die pad 12.

When seen from the thickness direction of the die pad 12, that is, in a planar view, each of the plurality of first conductive members 24 is famed into a straight line, and the plurality of first conductive members 24 are arranged parallel to each other. Moreover, the extending direction of each of the plurality of first conductive members 24 crosses the extending direction of the second conductive member 26. The extending direction of the first conductive members 24 and the extending direction of second conductive member 26 bisect each other, for example, at right angles. Here, the "right angles" have a concept containing ±5 degrees relative to 90 degrees, which means a concept containing a scope of degrees from 85 degrees to 95 degrees.

Because the first lateral surface 14a faces the inner end part and because the electrode pad SP is located close to the first lateral surface 14a, the electrode pad SP is linearly connectable to the inner end part 181 of the second lead 18 with the plurality of first conductive members 24, and the respective plurality of first conductive members 24 can be arranged parallel with each other. In other words, the plurality of parallel arranged linear first conductive members 24 can connect the electrode pad SP to the inner end part 181 of the second lead 18. Hence, the electrode pad SP is connectable to the inner end part 181 of the second lead 18 with shorter first conductive members 24, and the plurality of first conductive members 24 can be arranged evenly to the electrode pad SP.

By arranging the plurality of first conductive members 24, the currents can be supplied uniformly to the electrode pad SP, and uniformity of the current density in the semiconductor chip 14 can be achieved. Because each of the plurality of the first conductive members 24 can be linearly arranged, and because the plurality of first conductive members 24 can be arranged parallel, the difference in the plurality of first conductive members 24 can be reduced. Even in this regard, the uniformity of current density can be achieved.

When the plurality of straight first conductive members 24 are arranged parallel, a number of the first conductive members 24 connecting the inner end part 181 of the second lead 18 to the electrode pad SP can be readily increased, and more currents can be supplied to the semiconductor chip 14. As a result, the semiconductor device 10 having a great current capacity can be achieved. Moreover, because as seen from the thickness direction of the die pad 12, that is, in a planar view, the electrode pad SP can be linearly connected to the inner end part 181 of the second lead 18 without twisting the first conductive members 24, mounting the first conductive members 24 is easy.

Furthermore, because the lengths of the first conductive members 24 are short, inductance can be decreased, thereby improving a function of the semiconductor device 10. Because the heat of the semiconductor chip 14 is likely to disperse to the second lead 18 when the lengths of the first conductive members 24 are short, the radiation performance of the semiconductor chip 14 improves, and an increase in temperature of the semiconductor chip 14 can be reduced.

In the semiconductor device 10, the second lateral surface 14b that intersects with the first lateral surface 14a faces the inner end part 201 of the third lead 20, and the gate electrode pad GP crosses the second lateral surface 14b and is located close to the third lateral surface 14c located opposite to the first lateral surface 14a. In this configuration, because the distance between the inner end part 201 of the third lead 20 and the gate electrode pad GP can be shortened, the gate electrode pad GP can be connected to the inner end part 201 of the third lead 20 with a shorter second conductive member 26. In this case, the inductance is decreased, and the function of the semiconductor device 10 is improved. Moreover, because the gate electrode pad GP can be linearly connected to the inner end part 201 of the third lead 20, the second conductive member 26 can be readily mounted. Furthermore, the radiation performance improves and the increase in temperature of the semiconductor chip 14 can be inhibited due to the short length of the second conductive member 26 similar to the case of first conductive members 24.

In the embodiment where the electrode pad SP is formed into the rectangular shape as illustrated in FIG. 1, and the lengthwise direction extends from the second lateral surface 14b toward the fourth lateral surface 14d (extending from the fourth lateral surface 14d toward the second lateral surface 14b), because the electrode pad SP is likely to be readily connected to the inner end part 181 of the second lead 18 using the plurality of first conductive members 24, the plurality of first conductive members 24 is likely to be arranged more evenly. In addition, because a connection region of the plurality of first conductive members 24 is more readily ensured, the electrode pad SP is readily connected to the inner end part 181 of the second lead 18 with more of the plurality of first conductive members 24. Hence, current capacity of the semiconductor device 10 can be increased.

When the semiconductor device 10 is a power semiconductor device used for a power source and the like, for example, a wide bandgap semiconductor tends to be used in the semiconductor chip 14. In the semiconductor device using the wide bandgap semiconductor, a variation of the current density is preferably decreased because the switching speed is fast. Moreover, the semiconductor chip 14 using the wide bandgap semiconductor is operable with a great current. Thus, the semiconductor chip 14 using the great current needs to increase a number of the second conductive member 26 in order to cause the great current to flow through the semiconductor chip 14 and to decrease the resistance. Hence, the configuration of the semiconductor device 10 that can equalize the current density and increase the number of the second conductive members 26 is advantageous for a semiconductor device using the semiconductor chip 14 containing the wide bandgap semiconductor.

Second Embodiment

Figure 2:
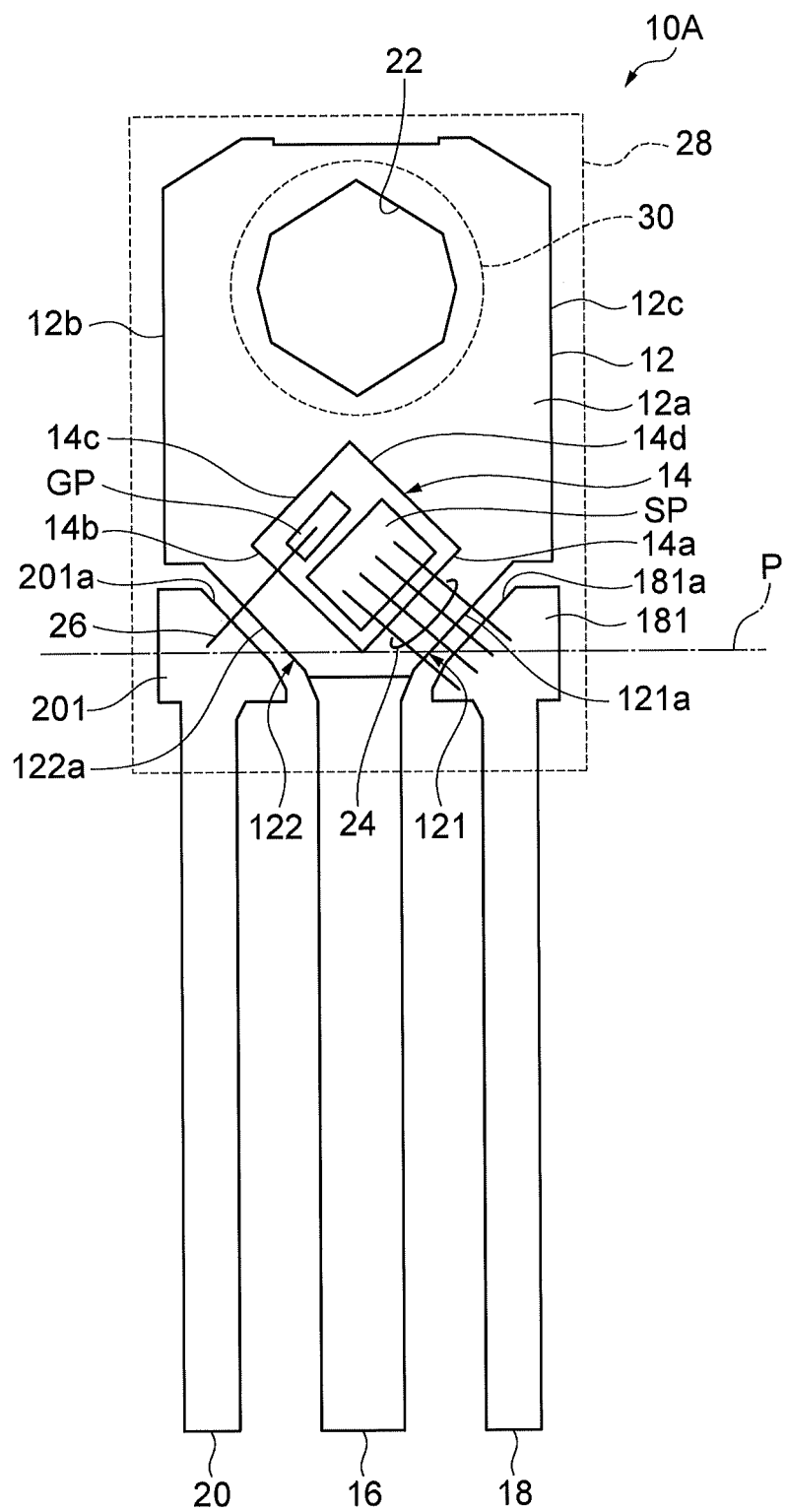
FIG. 2 is a plan view schematically illustrating a semiconductor device according to a second embodiment.

FIG. 2 is a planar view schematically illustrating a semiconductor device according to a second embodiment. The semiconductor device 10A illustrated in FIG. 2 differs from the semiconductor device 10 of the first embodiment in that shapes of a die pad 12, an inner end part 181 of a second lead 18 and an inner end part 201 of a third lead differ from those of the semiconductor device 10 in the first embodiment. Hence, the semiconductor device 10A is described below while focusing on the different points.

Bevel parts 121, 122 are formed on both sides of a connection part of the first lead 16 in the die pad 12 included in the semiconductor device 10A. The configuration of the die pad 12 illustrated in FIG. 2 can be the same as the die pad 12 illustrated in FIG. 1 other than this point.

In the semiconductor device 10A, the inner end part 181 of the second lead 18 is arranged to face the bevel part (first facing part) 121, and the inner end part 201 of the third lead 20 is arranged to face the bevel part (second facing part) 122. In other words, the bevels are famed in edges (corner parts) facing the inner end part 181 of the second lead 18 and the inner end part 201 of the third lead 20 in the die pad 12.

The die pad 12 illustrated in FIG. 2 may be produced by forming the bevel while removing the edges of the die pad 12 illustrated in FIG. 1. Otherwise, the die pad 12 having a shape illustrated in FIG. 2 may be directly produced using a mold.

In the inner end part 181 of the second lead 18 and the bevel part 121, facing surfaces 181a and 121a that face each other are parallel to each other, and in the inner end part 201 of the third lead 20 and the bevel part 122, facing surfaces 201a and 122a that face each other are parallel to each other.

The second lead 18 and the third lead 20 including such inner end parts 181 and 201 may be produced by removing part of the inner end parts to form the bevels after the second lead and the third lead are produced so as to have rectangular inner end parts in a planar view, for example. Otherwise, the second lead 18 and the third lead 20 may be directly produced so as to have the inner end parts 181 and 201 having the shape illustrated in FIG. 2.

In one embodiment, the semiconductor chip 14 is arranged so that the first lateral surface 14a is parallel to the facing surface 121a included in the bevel part 121. In this case, the first lateral surface 14a is also parallel to the facing surface 201a included in the inner end part 201.

In the semiconductor device 10A, the arrangement state of the semiconductor chip 14 is similar to the case of the first embodiment. Hence, the semiconductor device 10A has at least an operational advantage similar to the case of the semiconductor device 10 in the first embodiment.

In the semiconductor device 10A, the die pad 12 has the bevel part 121, and the facing surfaces 181a and 121a that face each other are parallel to each other in the inner end part 181 of the second lead 18 and the bevel part 121. Thus, the electrode pad SP is connectable to the inner end part 181 of the second lead 18 with the plurality of first conductive members 24 having an approximately uniform length. As a result, the current density can be made further uniform in the semiconductor chip 14. Moreover, in the configuration of the die pad 12 and the second lead 18 included in the semiconductor device 10A, the distance between the facing surface 181a included in the inner end part 181 and the facing surface 121a included in the bevel part 121 can be shortened. In other words, the inner end part 181 can be made closer to the bevel part 121. Hence, the distance between the inner end part 181 and the electrode pad SP shortens, and the lengths of the first conductive members 24 can be made further shorter. As a result, the radiation performance improves while the inductance can be decreased and the function of the semiconductor device 10A improves, thereby further inhibiting the increase in temperature of the semiconductor chip 14.

In the embodiment where the first lateral surface 14a is parallel to the facing surface 121a of the bevel part 121 of the die pad 12, because the differences of the lengths of the plurality of first conductive members 24 can be further decreased, the uniformity of the current density can be further achieved. In addition, the number of the first conductive members 24 can be readily increased because the connection region of the plurality of first conductive members 24 can be readily ensured.

In the semiconductor device 10A, the die pad 12 includes the bevel part 122, and the facing surfaces 201a and 122a that face each other are parallel to each other in the inner end part 201 of the third lead 20 and the bevel part 122. Hence, the distance between the inner end part 201 and the gate electrode pad GP is further shortened. Thus, the length of the second conductive member 26 can be further shortened. As a result, the inductance decreases, and the function of the semiconductor device 10A further improves. In addition, because the radiation performance improves, the increase in temperature of the semiconductor chip 14 can be further inhibited.

The configuration of the semiconductor device is more advantageous when the semiconductor chip 14 containing a wide bandgap semiconductor similar to the semiconductor device.

Although the embodiments have been described hereinabove, it is understood that the embodiments disclosed herein are illustrative and non-restrictive in any respect. The scope of the present invention is defined by the terms of the claims, rather than the embodiments described above, and is intended to include any modifications without departing from the scope of the present disclosure. For example, a semiconductor element is not limited to an element having a chip-like shape. The semiconductor element is not limited to a vertical transistor, but may be a lateral transistor. The shapes of the main electrode pad and the control electrode pad are not limited to a rectangle. For example, at least part of the main electrode pad may be located closer to the first lateral surface than the control electrode pad, and for example, the main electrode pad may be provided so as to surround the control electrode pad in a state of being insulated from the control electrode pad. In the second embodiment, facing surfaces that the first facing part facing the inner end part of the second lead includes and that the inner end part of the second lead includes may be parallel to each other among the die pads.

With respect to the above embodiment, the following numbered clauses are further disclosed.

(Clause 1)

A semiconductor device, including a die pad, a semiconductor element including a main electrode pad and a control electrode pad, mounted on the die pad, and electrically connected to the die pad;

a first lead integrally connected to the die pad;

a second lead arranged laterally away from the first lead; and a third lead arranged laterally away from the first lead, wherein the semiconductor element includes:

a first lateral surface facing an end part on the die pad side of the second lead;

a second lateral surface intersecting with the first lateral surface and facing an end part on the die pad side of the third lead;

a third lateral surface located opposite to the first lateral surface and intersecting with the second lateral surface; and a fourth lateral surface intersecting with the first lateral surface and the third lateral surface, wherein at least part of the main electrode pad is located on the first lateral surface, wherein the control electrode pad is located on the third lateral surface for at least part of the main electrode pad, wherein at least part of the main electrode pad is connected to an end part on the die pad side of the second lead with a plurality of first conductive members, and wherein the control electrode pad is connected to the end part on the die pad side of the third lead with a second conductive member.

(Clause 2)

The semiconductor device as described in clause 1, wherein the end part on the die pad side of the second lead is linearly connected to the main electrode pad when seen from a thickness direction of the die pad, and wherein the plurality of first conductive members is arranged parallel to each other.

(Clause 3)

The semiconductor device as described in clause 1 or 2, wherein an extending direction of each of the plurality of first conductive members is orthogonal to an extending direction of the second conductive member.

DESCRIPTION OF THE REFERENCE NUMERALS 10, 10A semiconductor device
12 die pad
14 semiconductor chip (semiconductor element)
14a first lateral surface
14b second lateral surface
14c third lateral surface
14d fourth lateral surface
16 first lead
18 second lead
20 third lead
24 first conductive member
26 second conductive member
121 bevel part (first facing part)
121a facing part
122 bevel part (second facing part)
122a facing surface
181 inner end part
181a facing surface (181a)
201 inner end part
201a facing surface

The invention claimed is:

1. A semiconductor device, comprising:
a die pad;
a first lead integrally connected to the die pad;
a second lead arranged laterally away from the first lead and provided apart from the die pad and the first lead;
a third lead arranged laterally away from the first lead and provided apart from the die pad, the first lead and the second lead;
a semiconductor element including a first lateral surface and a second lateral surface adjacent to each other and a third lateral surface located opposite to the first lateral surface and adjacent to the second lateral surface, and mounted on the die pad such that the first lateral surface faces an end on the die pad side of the second lead and that the second lateral surface faces an end on the die pad side of the third lead in a planar view;
a main electrode pad provided on a surface opposite to the die pad of the semiconductor element such that at least part of the main electrode pad is located on the first lateral surface side;
a control electrode pad provided on the surface opposite to the die pad of the semiconductor element such that at least part of the control electrode pad is located on the third lateral surface side;
a plurality of first conductive members electrically connecting the at least part of the main electrode pad to the end on the die pad side of the second lead; and
a second conductive member connecting the control electrode pad to the end on the die pad side of the third lead.

2. The semiconductor device as claimed in claim 1,
wherein the end on the die pad side of the second lead is linearly connected to the main electrode pad with the plurality of first conductive members in a planar view, and
wherein the plurality of first conductive members is arranged parallel to each other.

3. The semiconductor device as claimed in claim 1, wherein an extending direction of each of the plurality of first conductive members crosses an extending direction of the second conductive member at right angles.

4. The semiconductor device as claimed in claim 1,
wherein the third lead is arranged opposite to the second lead with respect to the first lead, and
wherein facing surfaces that a first facing part facing the end on the die pad side of the second lead in the die pad includes and that the end on the die pad side of the second lead includes are parallel to each other.

5. The semiconductor device as claimed in claim 4,
wherein facing surfaces that a second facing part facing the end on the die pad side of the third lead in the die pad includes and the end on the die pad side of the third lead includes are parallel to each other.

6. The semiconductor device as claimed in claim 4, wherein the first lateral surface is parallel to the facing surface included in the first facing part.

7. The semiconductor device as claimed in claim 1,
wherein the semiconductor element further includes a fourth lateral surface adjacent to the first lateral surface and the third lateral surface, and
wherein at least part of the main electrode pad is formed into a rectangular shape extending from the third lateral surface to the fourth lateral surface.

* * * * *